(12) United States Patent
Maula et al.

(10) Patent No.: US 8,367,561 B2
(45) Date of Patent: Feb. 5, 2013

(54) METHOD IN DEPOSITING METAL OXIDE MATERIALS

(75) Inventors: Jarmo Maula, Espoo (FI); Kari Harkonen, Kauniainen (FI)

(73) Assignee: Beneq Oy, Vantaa (FI)

( * ) Notice: Subject to any disclaimer, the term of this patent is extended or adjusted under 35 U.S.C. 154(b) by 408 days.

(21) Appl. No.: 12/663,782

(22) PCT Filed: Jul. 2, 2008

(86) PCT No.: PCT/FI2008/050403
§ 371 (c)(1),
(2), (4) Date: Dec. 9, 2009

(87) PCT Pub. No.: WO2009/004117
PCT Pub. Date: Jan. 8, 2009

(65) Prior Publication Data
US 2010/0167555 A1    Jul. 1, 2010

(30) Foreign Application Priority Data

Jul. 3, 2007 (EP) .................................. 07397023

(51) Int. Cl.
*H01L 21/31* (2006.01)
*H01L 21/00* (2006.01)
*H01L 21/8242* (2006.01)
*H01L 21/469* (2006.01)
*H01L 21/44* (2006.01)

(52) U.S. Cl. ............ 438/785; 438/240; 438/3; 438/660; 438/774

(58) Field of Classification Search ............ 438/785, 438/783, 778, 240, 3, 239, 608, 609, 618, 438/685, 653, 656, 680, 652, 660, 774, 788, 438/792, 648
See application file for complete search history.

(56) References Cited

U.S. PATENT DOCUMENTS 6,887,795 B2   5/2005   Soininen et al.
2004/0241976 A1*  12/2004  Fukuhisa et al. .............. 438/608
(Continued)

FOREIGN PATENT DOCUMENTS
WO    WO 2005/081789 A2    9/2005

OTHER PUBLICATIONS

Puurunen, "Surface chemistry of atomic layer deposition: A case study for the trimethylaluminum/water process," *Journal of Applied Physics*, Jun. 2005, pp. 121301-1-121301-52, vol. 97, No. 12, American Institute of Physics, USA.

(Continued)

*Primary Examiner* — Chuong A. Luu
(74) *Attorney, Agent, or Firm* — Oliff & Berridge, PLC

(57) ABSTRACT

The present invention relates to a method for enhancing uniformity of metal oxide coatings formed by Atomic Layer Deposition (ALD) or ALD-type processes. Layers are formed using alternating pulses of metal halide and oxygen-containing precursors, preferably water, and purging when necessary. An introduction of modificator pulses following the pulses of the oxygen-containing precursor affects positively on layer uniformity, which commonly exhibits gradients, particularly in applications with closely arranged substrates. In particular, improvement in layer thickness uniformity is obtained. According to the invention, alcohols having one to three carbon atoms can be used as the modificator.

22 Claims, 3 Drawing Sheets

U.S. PATENT DOCUMENTS

| | | | |
|---|---|---|---|
| 2005/0164487 A1* | 7/2005 | Seutter et al. | 438/618 |
| 2006/0035405 A1 | 2/2006 | Park et al. | |
| 2006/0172485 A1* | 8/2006 | Vaartstra | 438/240 |
| 2006/0205227 A1 | 9/2006 | Sarigiannis et al. | |
| 2007/0123060 A1 | 5/2007 | Rahtu | |

OTHER PUBLICATIONS

Kobayashi et al., "Two-stage atomic layer deposition of smooth aluminum oxide on hydrophobic self-assembled monolayers," *Engineering Letters*, May 2008, pp. 1-6, vol. 16, No. 2, Retrieved from <http://www.engineeringletters.com/issues_v16/issue_2/EL_16_2_07.pdf> on Oct. 15, 2008.

"The Condensed Chemical Dictionary," 1981, pp. 1-115, 208-366, 10th Edition, revised by G.G. Hawley, Van Nostrand Reinhold Co., NY, USA.

Elers et al., "Film uniformity in atomic layer deposition," *Chemical Vapor Deposition*, 2006, pp. 13-24, vol. 12, Wiley-VCH Verlag GmbH & Co. KGaA, Weinheim, Germany.

Rocklein et al., Conference Presentation: "AVS-ALD", Jul. 26, 2006, Seoul, Korea.

Utriainen et al., "Controlled electrical conductivity in $SnO_2$ thin films by oxygen or hydrocarbon assisted atomic layer epitaxy," *Journal of the Electrochemical Society*, Jan. 1999, pp. 189-193, vol. 146, No. 1, The Electrochemical Society, Inc., USA.

Ritala et al., "Growth of titanium dioxide thin films by atomic layer epitaxy," *Thin Solid Films*, 1993, pp. 288-295, vol. 225.

Ritala, Academic Dissertation: "Atomic layer epitaxy growth of titanium, zirconium and hafnium dioxide thin films," 1994, pp. 34-35, ISBN 951-41-0755-1, Helsinki, Finland.

Kim et al., "Property improvement of aluminum-oxide thin films deposited under photon radiation by using atomic layer deposition," *Journal of the Korean Physical Society*, Sep. 2006, pp. 1271-1275, vol. 49, No. 3, Korea.

Tatenuma et al., "Acquisition of clean ultrahigh vacuum using chemical treatment", *Journal of Vacuum Science and Technology*, Jul./Aug. 1998, pp. 2693-2697, vol. 16, No. 4, American Vacuum Society, USA.

International Search Report for International Application No. PCT/FI2008/050403 issued on Oct. 22, 2008 with written opinion.

* cited by examiner

METHOD IN DEPOSITING METAL OXIDE MATERIALS

FIELD OF THE INVENTION

The present invention relates to methods of manufacturing materials by employing sequential surface reactions. More particularly, the present invention relates to methods of manufacturing materials by employing an Atomic Layer Deposition (ALD)-type process. The presented method improves uniformity and/or enables to modify properties of materials prepared from metal halide precursors and precursors containing oxygen, said materials being deposited by using ALD processes and ALD-type processes.

Definitions and Concepts

Atomic Layer Deposition (ALD) has been used for over 30 years. Workers with various backgrounds have described, within this technique, the use of a great variety of combinations of chemicals, and an extremely wide range of methods and applications to combine chemicals.

For the purpose of this text, the following definitions are used. In other literature pertaining to ALD technology, the terminology may be different.

A material contains atoms.

A chemical substance is any material with a definite chemical composition.

A surface is an interface between a non-gaseous material and its surroundings. A surface will receive material during deposition, see below. On an atomic scale, a surface is 3-dimensional. The effect of atoms in deposition reactions extends beyond the dimensions of the atoms. During ALD deposition, a new surface is formed following each dosing pulse, containing non-inert chemical substances, see below.

Deposition denotes a process, in which material is added onto a surface.

A deposition zone is a limited surface exposed to all chemical substances used in a deposition cycle (see below) at the intended process temperature. Consequently, a deposition zone may also include zones of the systems for feeding chemical substances and pumping.

A precursor is a chemical substance that participates in a chemical reaction that produces another chemical substance, and is intended to form part of the film.

A dose is an amount of chemical substance (e.g precursor) supplied to a deposition zone. It is possible to supply several doses of different chemical substances at the same time and/or consecutively.

A dosing pulse or pulse for short means the time-limited exposure of a surface to a chemical substance or a mixture of chemical substances. The quantity of a particular chemical substance within each pulse may vary. The quantity may depend on intentional factors like the duration of the pulse, precursor temperature and pumping rate and/or other deposition system variations. The quantity may be varied intentionally, for example to adapt to different requirements of the coated surface, or because of the shape or volume of the reaction zone. For example, a small diameter trench often needs a longer exposure time than a flat surface due to the time required to expose the trench bottom to ALD deposition chemical substances.

A purge operation reduces the concentration of precursor in a deposition zone. Depending of the deposition reactor construction and process features, purging can be accomplished in various ways. In a cross flow reactor, the inert carrier gas flows continuously, and the purge step is often the period when only carrier gas flows. A purge operation can also contain additional chemicals to improve purging. Some ALD reactor designs do not use continuous carrier gas flow, or the flow is reduced during precursor dosing. In these reactors, a purge operation may include purge gas dosing and/or higher pumping speed than used during precursor dosing. Also combinations of the above mentioned principles may be used in purging.

A phase is a part of a deposition cycle.

A phase can include material transfer to a surface, for example:

Dosing and purging to supply metal-containing material(s) to a surface.

Dosing and purging to supply oxygen-containing material(s) to a surface.

It is important to understand, that material arriving at a surface typically undergoes a chemical reaction at the surface and the material(s) left on the surface after the dose is not necessarily the same as that dosed.

A phase can also have other functions, for example:

Dosing and purging to supply treatment material like ozone or alcohols to a surface.

Removal of material like hydrogen- and oxygen-containing chemical compounds from a surface.

Adding material like oxygen to a surface, using oxygen gas dosing.

Treatment or modification of a surface by using various energy sources like IR/UV light and/or plasma.

A cycle means a sequence of phases. A cycle must result in deposition. A cycle includes surface material growth reactions having essentially self-limiting growth features. Depending on the process and especially on the surface to be deposited, it is possible to start a cycle from any phase. Sometimes it is beneficial to start by providing oxygen-containing materials first, and sometimes a metal-containing precursor is preferred as the initial precursor.

A typical ALD type of deposition process consists of a sequence of cycles. For example:

N*Cycle

N1*Cycle1+N2*Cycle2

N3*(N1*Cycle1+N2*Cycle2)

N3*(N1*Cycle1+N2*Cycle2)+N4*Cycle4

N6*(N3*(N1*Cycle1+N2*Cycle2)+N5*Cycle1)

N being the number of repetitions. The terminology is further illustrated in the following tables.

TABLE 1

Typical, conventional ALD cycle for metal oxide deposition consisting of phase1 to supply metal-containing precursor and phase2 to supply oxygen-containing precursor.

| Dosing pulse M | | Dosing pulse O | |
|---|---|---|---|
| Dosing | Purging | Dosing | Purging |
| Phase1 | | Phase2 | |
| Cycle | | | |

TABLE 2

As in Table 1 but including an additional phase3
to treat or modify the surface
after dosing oxygen-containing precursor.

| Dosing pulse M | | Dosing pulse O | | Dosing pulse S | |
|---|---|---|---|---|---|
| Dosing | Purging | Dosing | Purging | Dosing | Purging |
| Phase1 | | Phase2 | | Phase3 | |
| Cycle | | | | | |

ALD deposition is based on surface reactions. Traditionally, only two reactive precursors are used and they are dosed to the deposition zone with purge in between. For example, precursor M may contain metal and precursor O may contain oxygen.

However, it is possible to supply several precursors to deposit M or O on the surface. In these cases, M or O can contain various kinds of atoms, originating from M1, M2 . . . or O1, O2 . . . , see Table 3.

TABLE 3

Examples of various ways to dose material.

| Dosing pulse 1 and 2 | | | | | | | |
|---|---|---|---|---|---|---|---|
| Dosing | Purging | | | | | | |
| Phase | | | | | | | |
| A) | | | | | | | |

| Dosing pulse 1 | Dosing pulse 2 | | |
|---|---|---|---|
| Dosing | Purging | | |
| Phase | | | |
| B) | | | |

| Dosing pulse 1 | | Dosing pulse 2 | |
|---|---|---|---|
| Dosing | Purging | Dosing | Purging |
| Phase | | | |
| C) | | | |

A) Several chemical substances or precursors can be dosed simultaneously.
B) Chemical substances or precursors can overlap, or be dosed essentially without purging in between.
C) Chemical substances or precursors can be dosed with purging in between.

It is also possible to dose the same material using repetitive pulses instead of one pulse.

Substrate is a term often used to describe the part or object to be coated. Substrate materials can be, for example, silicon, silicon oxide, silicon nitride, silicon carbide, doped silicon, germanium, gallium arsenide, glass, sapphire; plastics, ceramics, metals, metal nitrides, metal alloys, and other conductive materials, depending on the application. Substrates may have various dimensions. Examples are round silicon wafers of 200 mm or 300 mm diameter, and rectangular or square glass panes having dimensions up to several meters. Substrates may contain other thin films. The ALD method is especially suitable to achieve deposition on large areas, for example 3-dimensional parts like nanoparticles, catalyst supports or turbines or restricted zones or areas of parts. In some cases, the ALD deposition tool is being moved during the process instead of the substrate, especially when the item is very large. So, the term substrate may be obscure in various coating cases. In this application, the term "object to be coated" includes the above-mentioned cases.

An ALD process is a process in which deposition of material onto a surface is accomplished by means of one or more cycles. In a conventional ALD cycle, the reaction between two alternating precursors adds a new atomic layer to previously deposited layers to form a cumulative layer. The cycle is repeated to gradually form the desired layer thickness.

Lately, more complex deposition cycles have been introduced, for example cycles including several metal- or oxygen-containing precursors. ALD may also be referred to as atomic layer epitaxy, atomic layer processing, atomic layer CVD, cyclical deposition etc.

Self-limiting indicates a reaction where surface material S is exposed to dosed material A, and the amount of material A or the material and/or material B resulting from the reaction between material A and surface material S reaches a point where it does not essentially increase. In other words, the reaction does not essentially propagate beyond a certain saturation point, even with extended exposure time.

The coverage of active species on the surface varies up to full saturation, where the amount of active species cannot be increased. The saturation limit of a certain material or material combination used in a deposition cycle depends on the material and shape of the surface. The saturation limit may also depend on process conditions like temperature and carrier gas flow. Certain materials, like water, have a polar nature. When attached to a surface, polar materials can attach also to other polar materials, and this effect may cause the buildup of several material layers on top of each other.

When the ALD process is in the fully saturated region, the growth rate is very insensitive to dosing variations. Industrial ALD processes are not always in the fully saturated region, for example due to process throughput reasons. With small precursor doses, the ALD process still utilizes the self-limiting feature, but the film growth rate is more sensitive to the precursor dose. For example: A surface, which has been exposed to the metal chloride, contains chemisorbed, metal-containing species, and the following oxygen-containing precursor dose results in deposited material only up to an amount limited by the metal-containing species existing on the surface.

An ALD-type process refers to technologies that are more similar to ALD processes than to other deposition processes. In other words, a process may be called differently, but if it is based on cycles as defined in this text, it is closer to ALD than to other deposition technologies. In some cases, processes performed with tools designed for other purposes can actually be ALD processes. For example, chemical vapor deposition CVD, molecular beam epitaxy (MBE), gas source MBE, organometallic MBE, and chemical beam epitaxy when performed with alternating pulses of precursor material(s) utilizing self-limiting features, can sometimes be classified as ALD processes.

In this application, the use of the acronym ALD includes also ALD-type processes.

The term film or thin film is frequently used in coating industries. In this document, a film contains a single layer or several layers of material. The thickness of the film depends on the application and may vary within a wide range. ALD is often used in connection with so called "thin films". However, there is no general, unambiguous definition of "thin film". If material deposited by ALD is used in "thin film" technology, the thickness range is typically from one atomic layer up to a few tens of a micrometer. However, ALD technology can also be used for producing materials of a thickness up to tens of millimeters. Thus, for the purpose of this document, the word "film" is used to cover both so-called "thin films" and thicker materials.

The term oxide refers to all metal oxides (for example, titanium oxide, aluminium oxide, tantalum oxide) of various chemical composition, phase and crystalline structure. Correspondingly, where a stoichiometric chemical formula is used, as is common practice in the field, this does not necessarily imply that the layer in question has the corresponding absolute stoichiometric composition, but it can have a wide range of phases with varying metal/oxygen ratios.

A by-product is any substance whether gas, liquid, solid or mixture thereof, which results from the reaction of any deposition chemical substance flowing to the deposition zone, and which is not intended to be deposited on the surface in any amount comparable to that provided by the precursors. A by-product is a secondary or incidental product deriving from a manufacturing process or chemical reaction. A by-product can be useful or it can cause harmful consequences. For example, traces of chlorine typically occur in films made using chlorides. Chlorine can have positive or negative effects or no meaningful effect, depending on the application.

Metal or metal element refers to the elements of Groups IA, IIA, and IB to VIIIB of the periodic table of the elements along with the portions of Groups IIIA to VIA designated as metals in the periodic table, namely, Al, Ga, In, Tl, Ge, Sn, Pb, Sb, Bi, and Po. The lanthanides and actinides are included as part of Group IIIB; and the "lanthanides" and "actinides" are to be understood to include lanthanum and actinium, respectively. "Non-metals" refers to the remaining elements of the periodic table.

Adsorption is used to designate the chemical attachment of atoms or molecules on a surface.

Chemisorption as used herein refers to the chemical adsorption of vaporized precursor compounds on a surface. The adsorbed species are irreversibly bound to the surface as a result of relatively strong binding forces characterized by high adsorption energies (>30 kcal/mol), comparable in strength to ordinary chemical bonds. The problem of distinguishing between chemisorption and physisorption is basically the same as that of distinguishing between chemical and physical interaction in general. No absolutely sharp distinction can be made and intermediate cases exist, for example, adsorption involving strong hydrogen bonds or weak charge transfer. The chemisorbed species are limited to the formation of a monolayer on the surface. (See "The Condensed Chemical Dictionary", 10th edition, revised by G. G. Hawley, Van Nostrand Reinhold Co., New York, 225 (1981)).

The term layer refers to added material on the surface(s) after one phase, after several successive phases or after successive deposition cycles. The layer(s) may comprise, for example, epitaxial, polycrystalline, and/or amorphous material. In particular, the term atomic layer refers to added material on a surface after one phase or after one cycle.

A modificator is a chemical substance dosed in a deposition process, which chemical substance affects the deposition process but is not intended to form part of the film. Traces of modificator may remain in the film.

For pressure, the unit hPa, hectopascal, is used in this document.

BACKGROUND OF THE INVENTION

Atomic Layer Deposition (ALD), originally called Atomic Layer Epitaxy (ALE), is a thin film deposition process used for over 30 years. Recently, this technique has gained significant interest in the semiconductor, data storage, optical, biomedical and energy generation industries. The films made by this technique have exceptional characteristics, such as being essentially pinhole free and possessing excellent step coverage even in structures with a very high aspect ratio. The ALD technique is also well suited for precise tailoring of material compositions and very thin films (<1 nm). High repeatability and relatively low cost makes the method also attractive to produce demanding optical filters and artificial, tailored materials in general.

ALD-type technologies are self-limiting processes. However, this does not mean that the resulting deposited material is uniform over the whole coated object. The laws of nature provide natural self-limiting borderlines for reactions, but circumstances (like temperature, chemistry, topography) on the surface sometimes vary, or the partial pressures or flows of chemical compounds are uneven, all resulting in varying uniformity.

In other words, ALD-type procedures include various reactions and effects causing uneven deposition. These non-uniformities can be problematic, for instance:

Uneven materials thickness or another material property reduces the production capacity or can prevent coating of large objects.

The thickened portions of the layer can adversely affect step coverage.

Industrial applications require high uniformity and it is important to find ALD methods to achieve uniform properties for the deposited film.

A number of design principles for ALD tools are discussed below.

1) Cross-flow design, where gas flow carrying precursors enters from one side and the pumping exit is on another side. In addition to single wafer platforms, this mode can be applied for batch tools and tools for coating three-dimensional parts. Precursors can be fed through flow diffusers, showerheads, rotating pipes or through stationary pipes. The common flow paths for the precursors can be minimized or optimized.

2) Top-shower-head design, where precursors are supplied above the area to be coated. This mode has limitations in batch applications when objects to be coated are stacked.

3) Plasma can be applied directly above the object to be coated or be supplied from upstream. Plasma can be on during precursor dosing, or before or after the dosing to modify the coated surface. The use of plasma is difficult with batch tools where the objects to be coated are stacked, because the plasma may not distribute well and evenly inside the batch.

4) Diffusion mode. For example, semiconductor memories and large-area substrates may have deep trenches, and to expose and purge these trenches a long time is required. To reduce precursor consumption, it is economical to reduce or even stop pumping during precursor dosing.

5) The deposition tool can have hot or cold walls. Due to film growth on all exposed surfaces, the long-term practical use of thermal ALD typically requires hot wall. In plasma ALD tools, it may be possible to use the cold wall principle.

6) Typically, ALD tools operate at vacuum pressures below 10 hPa. However, pressures up to and above atmospheric pressure are possible.
7) Moving substrate. Typically, the object to be coated rotates.

At the moment, the semiconductor industry often uses single wafer or single pallet platforms. Most of ALD research is done without using batch. A reasonable amount of work has been done to improve the throughput of this kind of production tools. However, ALD is naturally compatible with large-area coating, because the deposition occurs on the surfaces exposed to precursors. The use of a batch or mini-batch system is economically more competitive. The display industry (for example Planar Systems Inc. TFEL production) has been using batch mode for over 20 years. Not much public material exists on batch systems, because research articles and most patents describe phenomena on single wafer systems. In practice, the batch ALD process often leads to more non-uniformity than does the same precursor chemistry when single wafer deposition tools are used. The cross-flow mode provides a relatively easy way to design batch tools, where objects are inside the coating volume, or inside the reaction chamber, installed on pallets or the like.

Accordingly, it is important to find ALD methods to achieve uniform film properties in a cross-flow batch mode.

Metal halides are good ALD precursors due to their high resistance against thermal decomposition. Metal halides are usually very reactive towards water. Metal chlorides are more common ALD precursors than metal iodides due to their higher vapor pressure.

Metal chlorides are also a low-cost source for metal atoms. Unfortunately, many ALD processes using chlorides are well known for the decreasing thickness in the precursor flow direction.

Accordingly, it is desirable to develop chloride-based ALD processes for obtaining high film uniformity.

Many ALD processes using water suffer from the variation of the growth rate due to variation of the amount of dosed water, and sometimes due to the purge time after the water dose. This does not mean that those processes are not ALD-type processes, but the self-saturation takes time and industrial processes often use shorter pulses than required for full self-saturation. This growth rate dependency on the water dose causes problems, especially with large coated areas and in batch setups. For example, differences in the water vapor flow causes varying local partial pressures, resulting in varying exposure of the surface to precursors. There is little uncertainty concerning the thermodynamic properties of water, which can be measured with more or less standard laboratory equipment. However, a lot of unsolved problems remain in the details of the water molecule structure and its relation to the forces acting between molecules. Water is a very polar molecule. It is generally believed, that the properties of water are simultaneously determined both by short-range attractive forces (identified as H-bonding), and strong long-range electrostatic (primarily dipole-dipole) interactions. The properties of water may cause molecular water on the surface after each water dose to an ALD tool, even at high temperatures.

The effect of increased ALD film growth rate vs. increased water dose is a well-known effect. One possible explanation for the increased rate is the occurrence of molecular water on the surface.

Generally speaking, most chloride-based ALD processes using water show a deposition thickness gradient, with thickness decreasing towards the flow exhaust side. It is important to notice that in addition to thickness non-uniformity, which is relatively easy to measure, there are many other material property non-uniformities. As examples may be mentioned refractive index, chlorine content, density, crystalline structure, permittivity, conductivity and work function.

Accordingly, it is desirable to develop ALD processes where the non-uniformity due to water vapor dosing and purging can be reduced.

A paper from Elers et al., *Film Uniformity in Atomic Layer Deposition*, Chem. Vap. Deposition 2006, 12, 13-24, presents an overview of the film uniformity challenges the industry is facing in the development of ALD processes. In particular, chapter 3.2. "Gaseous By-Products of the Surface Reaction" explains well the state of the art relating to this invention.

Concerning halide processes, the article mentions two important issues.

1. "One (little studied) source is a downstream non-uniformity issue caused by upstream reaction by-products. It has been speculated that the by-products can block active sites by adsorbing onto the surface, or even participate in a reverse reaction."

2. "Although there are no comprehensive results to show how the uniformity degrades on the substrate, there is a strong assumption that non-uniformity is mainly caused by the hydrogen chloride by-product." The article describes three proposed theories for explaining the non-uniformity; however, no methods to reduce the non-uniformity of halide processes are suggested.

Concerning metal alkoxide/$H_2O$ processes, the article mentions important issues.

"As with the metal halide processes, the metal alkoxide processes suffer from a small thickness non-uniformity, i.e., decreasing film thickness in the flow direction. As with HCl in the metal halide process, ethanol was proposed as a cause of the non-uniformity in the metal alkoxide process. The influence of by-products can be studied by introducing ethanol vapor with, or just after, the water vapor pulse. This increases the absolute amount of by-product species over the substrate and therefore reduces the relative concentration gradient of by-product species in the flow direction. Some preliminary results from such experiments have shown that the uniformity profile can be improved and even reversed, such that the film is thinner at the front-end than at the back-end of the substrate. In addition, a lower growth rate is observed when ethanol is introduced. Based on these observations, it has been speculated that ethanol can react with —OH sites, releasing water. A lower growth rate would then result from the decreased number of the reactive —OH sites. As in the metal halide process, it can be proposed that released water reacts with the metal alkoxide in the gas phase or in the reaction chamber surface, forming a particle."

In the cross-flow reactor, the concentration of by-products increases in the direction of flow. By adding by-product (in this case ethanol) to the incoming flow, it is possible to cause this [speculated] adsorption and active site blocking effect also on the incoming side of the cross-flow reactor. The by-product of the reaction between metal alkoxide and water is alcohol, and the article describes a method to improve non-uniformity by supplying by-product, ethanol, together or after the water dose.

Rocklein et al (Conference presentation: AVS-ALD, Seoul Korea, Jul. 26, 2006) have disclosed a method called Compensated Atomic Layer Deposition, using HCl to compensate for inherent non-uniformities of deposition tool or process, thereby improving across-wafer uniformity and step coverage at the expense of deposition rate. In this particular connection, the HCl has been defined as a surface-poisoning gas.

In a paper from Utriainen et al., *Controlled electrical conductivity in $SnO2$ thin films by oxygen or hydrocarbon assisted atomic layer epitaxy*, Journal of the electrochemical society, 146 (1) 189-193 (1988), a method is described involving an ALD process using $SnCl_4$ and $H_2O$. Without modifications, the process results in a typical decreasing thickness profile in the flow direction. If hexane, $C_6H_{14}$, was dosed after the water, it reversed the usual deposition profile. Depositions were done at a temperature of 500° C. In studies made by the present inventors, it was not possible to observe clearly positive effects of hexane at 300° C. using a $TiCl_4$+$H_2O$+hexane sequence.

According to Ritala, Leskelä et al., *Growth of titanium dioxide thin films by atomic layer epitaxy*, Thin Solid Films 225 (1993) 288-295, a $TiO_2$ deposition thickness profile can be avoided by leading the reactants to the reaction chamber through a common line. This is probably true as long as the effects from upstream (i.e. HCl gas, which is known to have an effect on layer uniformity) are large enough in relation to the required deposition area. In other words, whatever the upstream effect is, once its effect is large enough, it causes result similar to that of a long deposition length. If the deposition area is small related to the upstream area, then the measured film uniformity is better. However, up-scaled processes for large areas and batches have a clear uniformity profile and may require a sacrificial zone in front of the deposition area. This reduces capacity and increases cost.

The article explains growth rate variation when different glass substrates are arranged facing each other. The rate was different on different substrate materials, and especially interesting was that substrates were affected by the facing surface. The distance between substrates was 2 mm. However, the article does not teach how to decrease this non-uniformity.

The literature provides different opinions concerning molecular water on surfaces. According to Ritala, Academic Dissertation "Atomic Layer Epitaxy growth of Titanium, Zirconium and Hafnium dioxide thin films". Helsinki, Finland 1994. ISBN 951-41-0755-1 page 35, "contribution of molecular water to the film growth can be considered insignificant at the temperatures where the saturated film growths took place". This document also includes speculation regarding the reasons why the substrate affects film growth: "A more complicated question is how the substrate can affect the growth rate even long after it has become fully covered by the film. It seems that the only way to explain this is that the growth proceeds by a chain mechanism where the density of reactive sites left on the film surface after a deposition cycle is strictly related to their density prior to that cycle. Apparently, the existence of such a chain mechanism is more feasible if surface hydroxyls do act as intermediate species."

However, the article does not teach how to decrease this non-uniformity.

Test runs carried out over the years by the present inventors have confirmed that the effects described by Ritala exist, and that they cause difficulties when surfaces are near each other. One example is shown in FIG. 1.

According to Kim, *Property Improvement of Aluminium-Oxide Thin Films Deposited under Photon Radiation by Using Atomic Layer Deposition*, Journal of the Korean Physical Society, Vol. 49, No. 3, September 2006, pp. 1271-1275, "For UV exposure after $H_2O$ injection (UV2), the hydroxyl groups weakly bonded to the surface may be removed by photolysis before the injection of TMA. Thus, film formation through the reaction between TMA and weakly bonded hydroxyl groups may be eliminated." Kim used ultraviolet (UV) radiation to improve aluminium-oxide thin film properties in a trimethylaluminium-and-water ALD process. An important target of the work of Kim et al was to improve the properties of ALD aluminium oxide film by using UV radiation.

Several patents and applications mention the combined use of water and other oxidizers. For example in US20060035405 of Park, it is disclosed, that "oxidant may include ozone ($O_3$), water ($H_2O$) vapor, hydrogen peroxide ($H_2O_2$), methanol ($CH_3OH$), ethanol ($C_2H_5OH$) and the like. These oxidants can be used alone, i.e., individually, or in combination with other suitable oxidants." According to this document, the purpose of using several oxidizers is to improve oxidation. However, this prior art application does not provide any information on the possible benefits or effects when said combinations are carried out.

Application US 2006/0205227 from Sarigiannis describes a method where the normal ALD cycle using two precursors leaves residues, and a third gas is introduced to remove those residues. The application suggests the gases $Cl_2$, $O_2$ and $H_2$ for removing residues. It is not explained what consequences such a combined use might cause, and it is not defined which combinations are preferred.

In U.S. Pat. No. 6,887,795, a process is disclosed for producing conductive thin films by producing a metal oxide layer by an ALD type process and essentially converting the metal oxide into an elemental metal by reduction using one or more organic compounds such as alcohols, aldehydes and carboxylic acids.

In US patent application publication 2007/0123060, a method is disclosed for enhancing the volatility of reactants and/or by-products in deposition processes by means of coordinating ligands, which are added to the sequence. The result is improved layer uniformity.

Various methods are used to affect surface water in technologies not directly related to ALD. For example, an interesting idea is to use a chemical having a particular affinity for water to react with the water adsorbed on a surface in such a way that the reaction products are gases, which may be pumped away. One such chemical is dichloropropane, and the reaction is $(CH_3)_2CCl_2 + H_2O \Rightarrow (CH_3)_2C=O + 2HCl$. This technique is claimed (Tatenuma et al, J Vac Sci Technol A16, 1998, 263) to reduce the base pressure in a vacuum system by factor of 80. This or similar methods or chemicals may be usable with ALD technology for changing film properties.

In batch setups, several phenomena occur which are not easily visible from the results of single wafer tool processes.

Small distances between surfaces may cause strange effects. In some cases, for example with $TiCl_4+H_2O$ processes, the growing film is affected by the opposite surface and some of its properties. Features of the opposite side are visible in the deposited film structure. The visible effect can be for example the change of the refractive index and/or film thickness. This effect causes difficulties to increase deposition capacity. The reason for this effect is unknown. It may be that the effect is caused by electrical fields from functional OH groups and/or polar water molecules attached on the surfaces. The effect of the deposition surface, under the growing film, on growth rate is well known to ALD workers.

Decreased flow channel cross section area between surfaces increase by-product partial vapor pressure. Thus all effects from by-products are the stronger, the smaller is the distance (and the higher the deposition capacity) between surfaces.

An enlarged deposition area increases by-product partial vapor pressures and causes effects from by-products, similar to those of a decreased flow channel area.

Non-uniformity eventually causes flaking of the cumulative film on the coated jigs, walls and other construction parts. Flaking typically starts from the inlet side, where films are thicker. This causes increased cost due to required cleaning.

Alcohols are widely used as solvents. Generally, hydroxyl group compounds are polar, which tends to promote solubility in water. But the carbon chain resists solubility in water. Short chain alcohols (methanol, ethanol, and propanol), in which the hydroxyl group predominates, are miscible in water. Butanol is moderately soluble because of the balance between the two opposing solubility trends. Higher alcohols are practically insoluble in water because the influence of the hydrocarbon chain is stronger.

The existing literature gives several opinions and facts concerning non-uniformity in cross flow halide—water processes as described above.

It has been speculated that the by-products can block active sites by adsorbing onto the surface, or even participate in a reverse reaction. In the cross-flow reactor, the concentration of by-products increases in the direction of flow. For example in the reaction $TiCl_4+H_2O => TiO_2+HCl$ it is speculated that the HCl or chlorine attaches to the surface, reserving surface sites and thus causing decreasing thickness in the flow direction. Similarly, ethanol is proposed as a cause of the non-uniformity in the metal alkoxide processes.

It is also possible that molecular water is attached to a surface. Water is a very polar molecule. With deposition using chlorides it may be that the reaction by-product HCl removes "loose molecular water" from the surface. HCl is a polar molecule.

A known method to improve uniformity is to use HCl gas. A dose of HCl after a $H_2O$ or halide dose might increase the effects of HCl also on the upstream zone, which otherwise would be stronger on the downstream zone. However, HCl is a dangerous, corrosive gas and thus often not accepted in the production environment.

SUMMARY OF THE INVENTION

In search of a method to improve layer uniformity in ALD or ALD-type processes, the inventors found that when using metal halides as first precursors and the oxygen-containing second precursors $H_2O$, $H_2O_2$ or tert-butanol, the introduction of a dose of modificator subsequent to a dose of the oxygen-containing precursor surprisingly had a very positive effect on deposition uniformity.

In particular, this positive effect is obtained when metal oxides are deposited using metal halides. Further, positive results were achieved when coating electrically insulating surfaces.

The expressions first and second precursor do not imply any particular pulse order within a cycle; the starting point of a cycle may be defined as is found expedient by persons skilled in the art. However, the introduction of modificator occurs following a pulse of the second precursor as defined above.

Preferable metal halide precursors according to the invention are metal chlorides. Examples are titanium tetrachloride, aluminium trichloride, hafnium tetrachloride, zirconium tetrachloride, niobium pentachloride and tantalum pentachloride. Oxides having other stoichiometry may also be used. The oxygen-containing precursors are selected from the group consisting of water (including HDO and deuterium oxide), hydrogen peroxide and tert-butanol (including deuterated homologues).

As modificators according to the present invention, alcohols having 1-3 carbon atoms are used, i.e. methanol, ethanol, i-propanol and n-propanol. Preferable modificators are ethanol ($C_2H_5OH$) and methanol ($CH_3OH$).

According to an embodiment of the invention, several alternating pulses of second precursor and of modificator may be used prior to the introduction of the first precursor. According to a further embodiment, pulses of the second precursor and pulses of modificator may overlap fully or partially. For example, the modificator pulse may continue after the pulse of second precursor has ceased.

Purging may be used following a modificator dose and/or a dose of any precursor, according to the choice of the skilled person.

Although the sequence mentioned in the Elers article discussed above uses a sequence similar to that of the present invention, i.e. water-ethanol, according to the invention metal alkoxides are not used as metal-containing precursors. Thus, the surface is exposed to a modificator which is not essentially a by-product in any phase. Though ethanol has been suggested as a cause of the non-uniformity in the alkoxide process, surprisingly the use of ethanol according to the present invention enhances uniformity.

The method of the invention is carried out in ALD or ALD-type processes as defined above. The amount of modificator provided after the dose of second precursor is of importance for the efficiency of the method according to the invention.

The required uniformity depends on the application. Industrial applications typically require low cost precursors and fast processing. Also, it is important to pay attention to safety issues. In some cases, the chemicals and/or by-products resulting from the use of said chemicals cause harmful effects. Especially ethanol and methanol are low cost, reasonably safe and easy to use in a deposition tool. Moreover, the use of industrial grade chemicals as precursors or as modificator is feasible due to the nature of the selective chemisorption, as long as the application does not require high purity chemicals for other reasons.

The present invention describes several modificators, which can be used for the purpose to reduce deposition rate and to reduce or to eliminate layer non-uniformity in an ALD or ALD-type process.

In addition to reducing non-uniformity in physical thickness, which is relatively easy to measure, there is a possibility to reduce other material property non-uniformities. Examples are refractive index, chlorine content, density, crystalline structure, permittivity, conductivity and work function. An observable effect, as shown in the attached examples, is that modification with ethanol increases the refractive index. That is an indication of more dense material.

Several methods have been described in ALD for removing weakly bonded material from surfaces during the cycles, for example by using UV energy. Some plasma-enhanced processes may cause more dense films than the corresponding processes without plasma enhancement. The use of a modificator following precursor doses provides particular benefits for batch processes, where UV or plasma treatments are difficult to use. The use of chemical vapor to modify surfaces and the resulting material properties is a very valuable method in a wide range of processes and deposition tools, because surfaces are easily exposed to the modificator. For example, modificator can reach locations hard to reach when UV, plasma or similar treatments are used. With UV, there are limitations due to shadowing of the energy flow, and with plasma the lifetime of radicals may limit usability.

In addition to improving uniformity in the flow direction, the use of a modificator can also improve uniformity in high aspect ratio structures like semiconductor memory trenches, 3D transistor structures, nanotube and nanowire applications. Also conventional parts having larger dimensions benefit from the present invention; for example, tube inner surfaces and parts having holes and cavities, complex 3-dimensional parts like turbines and articles having zones or areas hard to access. Some physically small objects actually have a large surface area; examples are powders, catalyst supports and nanoparticles. The present method improves coating uniformity in these applications.

An easily measurable effect resulting from the use of a modificator is the reduction of the material growth rate. A small modificator dose may reduce the growth rate at the flow inlet. When the dose is increased, the growth rate may be reduced also on the flow exhaust side.

The use of modificator with large flow channels may not give as clear effects as with a setup having small flow channels.

Typically, the deposition non-uniformity observed in ALD processes using metal chlorides is caused by the HCl by-product. Consequently, non-uniformity effects are the stronger the higher is the HCl partial pressure. Especially in batch applications, a small distance between substrate objects is economically beneficial. However, a small distance increases the HCl partial pressure and increases non-uniformity.

The improvement of the film uniformity when the present method is used is particularly clear in cases where the HCl by-product partial pressure or concentration difference is high between various locations of the coated object. For example, when surfaces of the coated objects are near each other, like in batch applications (where objects are often in a pile with a small distance between the surfaces to be coated), or the inner side of a tube.

When chloride and water precursors are supplied through a common delivery line, upstream to the object to be coated, they generate HCl by-product which will function in a manner similar to that of the modificators of the present invention, and improve uniformity in the downstream zones. If the amount of HCl is large enough in relation to the object being coated, the effect of the modificator may be smaller. It is possible to improve uniformity by adding surface in front of the objects to be coated. The purpose of this added surface, for example with chlorides, is to generate HCl by-product gas, which eventually improves uniformity in the downstream region. This added surface may reduce production capacity and increase cost. In other words, the present invention is of high importance in batch applications, in the coating of large areas and long objects.

One surprising effect of the modificator was that both effects of the object to be coated itself and effects from the surrounding surfaces on the deposited film were greatly reduced. It is possible that molecular water exists on the surface without the modificator, and the environment affects the water molecules. This effect is especially strong with $TiO_2$ film. These effects have caused difficulties to develop high capacity ALD batch processes. The use of modificator makes it possible to bring coated surfaces very near each other, and it also reduces the effects on the film being deposited originating from the substrate itself. The distance between substrate surfaces may be less than 12 mm, preferably less than 5 mm, more preferably less than 1 mm. The distance between surfaces to be coated may be even less than 1 micrometer.

Although the proposed method was tested at vacuum pressures, it is possible that this method also provides positive effects in atmospheric and high-pressure ALD processing systems.

DESCRIPTION OF PREFERRED EMBODIMENTS

Figure 1:
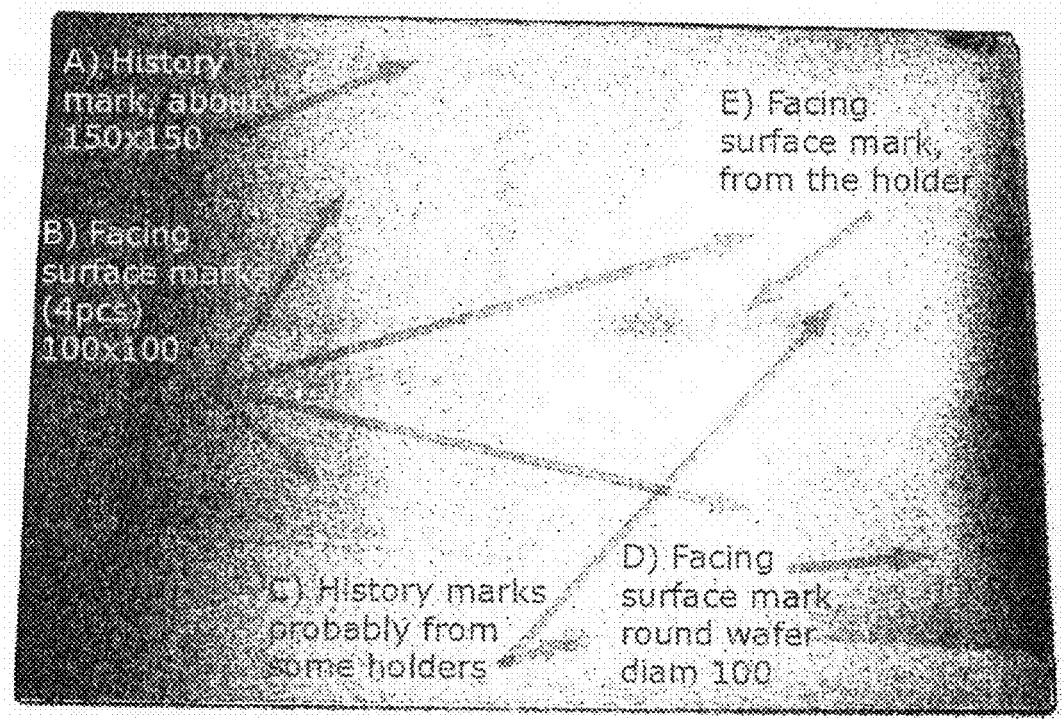
FIG. 1 shows the effect of the surroundings on an ALD-coated glass test plate when distances to facing surfaces are small during the coating process.

A metal oxide layer is preferably produced by an ALD or ALD-type process. A typical ALD-type process according to the invention comprises the following steps:
1) exposing a surface to at least one metal halide precursor,
2) essentially removing other than possible purging gases from the deposition zone,
3) exposing the surface to at least one oxygen-containing precursor,
4) at least partially removing other than possible purging gases from the deposition zone.
5) exposing the surface to at least one modificator substance,
6) at least partially removing other than possible purging gases from the deposition zone, and repeating 1) through 6) until the desired thickness of deposited material is reached. 1) and 2) form a phase to dose metal halide, 3) and 4) form a phase to dose oxygen-containing precursor, and 5) and 6) form a phase to dose modificator.

The deposition zone can be purged either by pumping the zone to a lower pressure or by purging the chamber with a continuous inert gas flow or an inert gas pulse, or by combinations of pumping and purging.

The inert carrier gas(es) are typically introduced with the vaporized precursor and modificator compound(s) during each cycle.

Preferably, the method according to the invention includes at least partly removing chemically active agents before and after the modificator dose. According to the knowledge and the preferences of those having ordinary skill in the art, a determination can be made as to the minimum degree of purging before performing the next phase.

According to the ALD principles, the deposition zone is essentially purged of the dosed metal precursor and the gaseous by-products of the surface reaction before the next pulse of a precursor is introduced into the deposition zone.

Typically, modificators do not react with oxygen- and/or metal-containing precursors causing harmful consequences. It is often possible to reduce the purging time in these phases. The purging time can be adjusted according to the requirements of the object to be coated. To decrease process time, especially 3) and 5) can even overlap, eliminating 4), but 3) must be finished before finishing 5).

5) is not a typical ALD step. It reduces the growth rate per ALD cycle, and its nature during deposition is not essentially self-limiting. The dose in 5) can be adjusted according to the requirements of the object being coated.

The use of modificator according to the invention involves two modes of operation. In the first mode, the growth rate is reduced to value lower than the value in the absence of modificator, the growth rate being essentially the same on the whole surface of the object to be coated. This first mode typically produces more dense material than is produced in the absence of modificator.

In the second operation mode, the film growth rate is affected mainly on the inlet side. Often, without the use of modificator, the film becomes thicker at the flow inlet than elsewhere. In the second mode of operation, a smaller modificator dose is used than in the first mode, whereby the growth rate at the flow inlet is reduced to a suitable level, resulting in more uniform deposition than without the use of a modificator. A small dose of the modificator only affects the flow inlet side, reducing film thickness locally. Both operation modes have benefits and drawbacks depending of the case. The first operating mode is the normal operating mode and this provides better uniformity than the second operation mode, which gives higher throughput.

Additional steps may be added to the ALD cycle as desired, for example to incorporate additional species into the film.

It is possible to speed up the process by not using 5) and 6) in each deposition cycle.

It is possible to start the cycle from any of 1) to 6), but preferably the method according to the invention includes all steps 1) to 6) in sequence at least once. Thus, an embodiment of the present invention involves treating a halogen-containing surface S1 with oxygen-containing precursor and modificator, to provide a metal oxide surface S2.

It is clear to persons skilled in the art, that the order of the phases can be modified so that 1) and 2) can also be after 6).

Concerning the pressure and temperature in the deposition zone, the modificator step according to the invention does not set specific limits.

The method according to the invention can typically be added to an established ALD cycle. The chemical substance used as a modificator needs to be selected according to each case. Concerning the type of the ALD deposition tool, the method according to the present invention can be readily implemented in known ALD tool designs by adding the modificator supply.

During the ALD process, numerous consecutive deposition cycles are conducted in the deposition zone, each cycle depositing a very thin metal oxide layer (usually less than one monolayer such that the growth rate on average is from about 0.02 to about 0.2 nm per cycle), until a layer of desired thickness is built up on the object to be coated.

Typically, the dosing and/or purging step duration is from about 0.05 to about 10 seconds, preferably from about 0.1 to about 3 seconds.

There are no particular limits for the thickness of the film produced according to the invention. The film thickness may vary from one atomic layer up to tens of millimeters. Thus, the number of cycles in a method according to the invention may be in the order of hundreds of thousands.

Advantageously, the method of the present invention can be used in batch ALD reactors. An example of a suitable deposition application is the production of optical films and film stacks. These may contain titanium oxide, silicon oxide, aluminium oxide or combinations of these, preferably on glass substrates. Another example of advantageous substrates in the method of the present invention is electrical insulators, like organic polymers, glass, ceramic materials and quartz.

Oxides are widely used as insulators in a wide range of applications. Thus, dielectric films and film stacks may be deposited according to the present invention, said films containing e.g. titanium oxide, aluminium oxide, hafnium oxide, zirconium oxide, tantalum oxide and niobium oxide.

In addition to large-area objects and objects having complicated three-dimensional structures, substrates advantageously coated using the method according to the invention include the inner surfaces of tubular structures, whereby the precursors and modifiers are conducted through the tubular structure.

An example of the effects of the substrate environment is shown in FIG. 1, which is a photograph of a soda lime glass test plate having the dimensions 195×265×1.1 mm. The dimensions indicated in the figure are in millimeters. The test plate was washed using processes for industrial display production, and there were no signs of contamination. The glass plate was uncoated before the process. The plate was fixed in a holder shelf, touching the glass only from the edges. It was coated using about 90 nm of $TiO_2$ at a deposition temperature of about 300° C.

The photo was taken with a typical, digital hand held camera and the visible anomalies are caused by non-uniformities in the $TiO_2$ coating. Below the test plate during the coating was a holder plate for 5×100 mm round substrates, and above it was a holder plate for 4×100×100 mm square substrates. The distance from the test plate surface to the facing surfaces on both sides was about 8 mm.

At A and C, history marks on the test plate are visible. At some moment during the history of the test plate, a 150×150 mm square plate, probably also glass, has been placed on this test plate. No objects of this size were available on the ALD coating site, where the test plate had been stored months before the coating. Also, the ALD coating site does not have holders or jigs touching the points C. The origin of these marks is not known, but the TiO2 coating makes them visible.

FIG. 1 is a clear indication, that glass material can "remember" contacts with other parts for a long time, and that $TiO_2$ coating can reveal these contacts.

The ability to see some history of the glass can be beneficial in some cases, but in typical coating process this is a harmful effect. The coating on the surface should be uniform and the effects from the object to be coated should be minimized.

At B and D, marks from the facing substrates are visible. All the 4×100×100 mm square glass substrates are clearly visible. These were coated earlier with similar $TiO_2$.

The marks of the round 100 mm substrates are shifted downstream about 30 mm. These wafers were "dummy wafers" having various coatings. The bottom right side wafer is clearly visible in the figure, while the center wafer is visible, but difficult to see.

The effects of the neighboring substrates over a long distance limit the capacity of the deposition tool.

At E, marks from the facing holders may bee seen. The effects of the holder and jigs over a long distance limit the capacity of the deposition tool.

All the harmful effects shown in FIG. 1 disappeared when a modificator was used.

Figure 2:
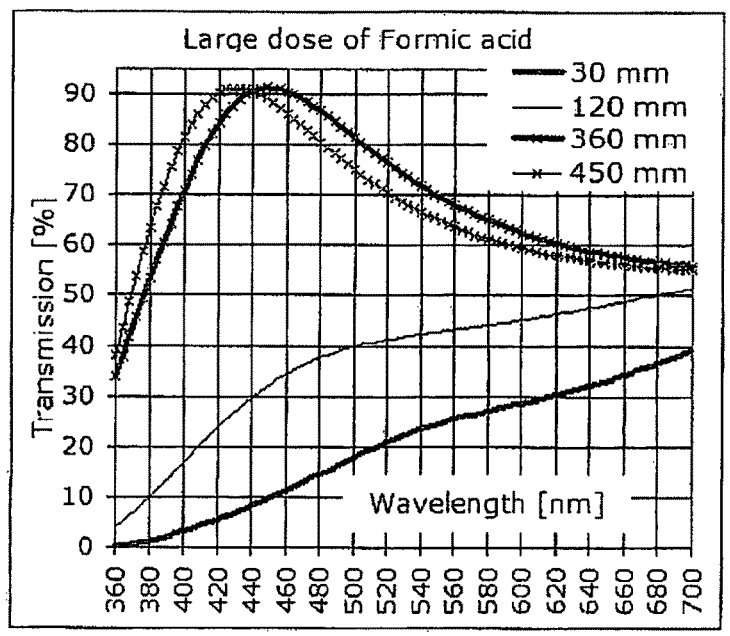
FIG. 2 shows the effect of a large dose of formic acid.

For use as a modificator, there is a variety of possible chemical compounds. In connection with the present invention, the effect of carboxylic acids was investigated. It was observed, that these cause effects similar to those of the selected modificators, but overdosing clearly destroys the deposited film. FIG. 2 shows the effect of a large dose of formic acid. The transmission measurements have been made from a 0.3 mm thick D263 glass coated on both sides. Measurements were made from four positions along the flow path. Distances are measured from the edge of the support shelf in the batch. It is clearly seen, that a large dose of formic acid destroys the transmission.

Figure 3:
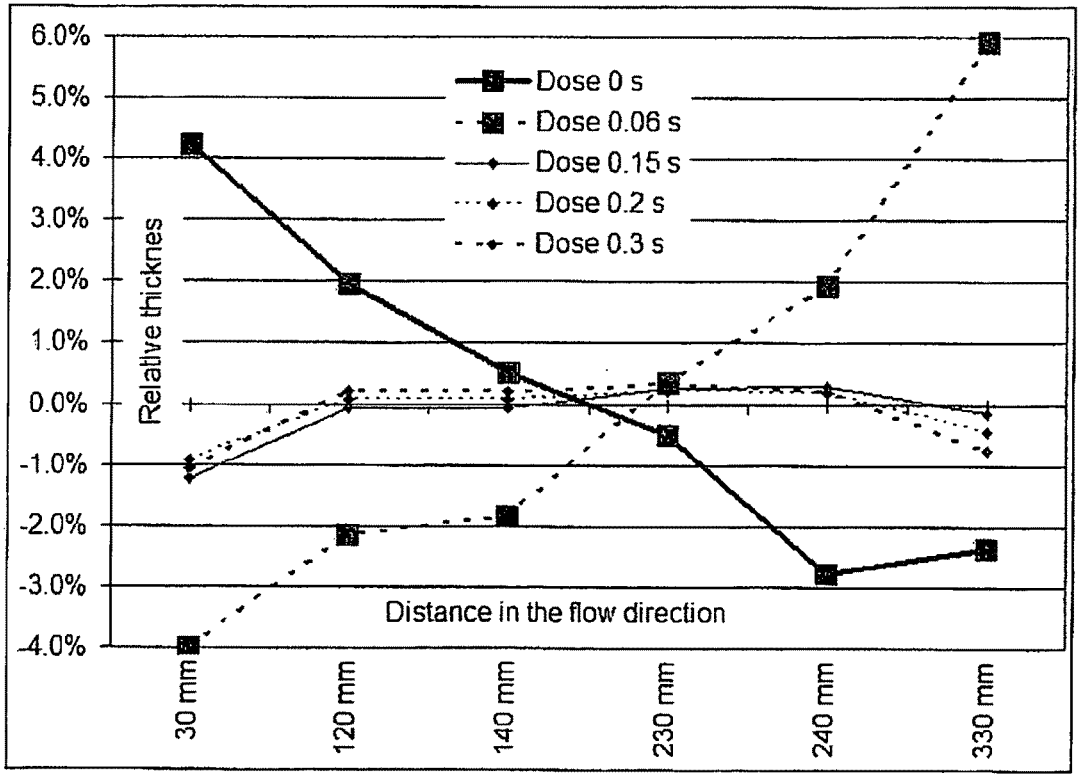
FIGS. 3 and 4 demonstrate effects on deposition profile and average thickness as a function of modificator (ethanol) dose.

FIG. 3 shows the effect of the ethanol dose amount on the thickness profile in the flow direction. The relative thickness values are relative to the average thickness for each dosage.

Figure 4:
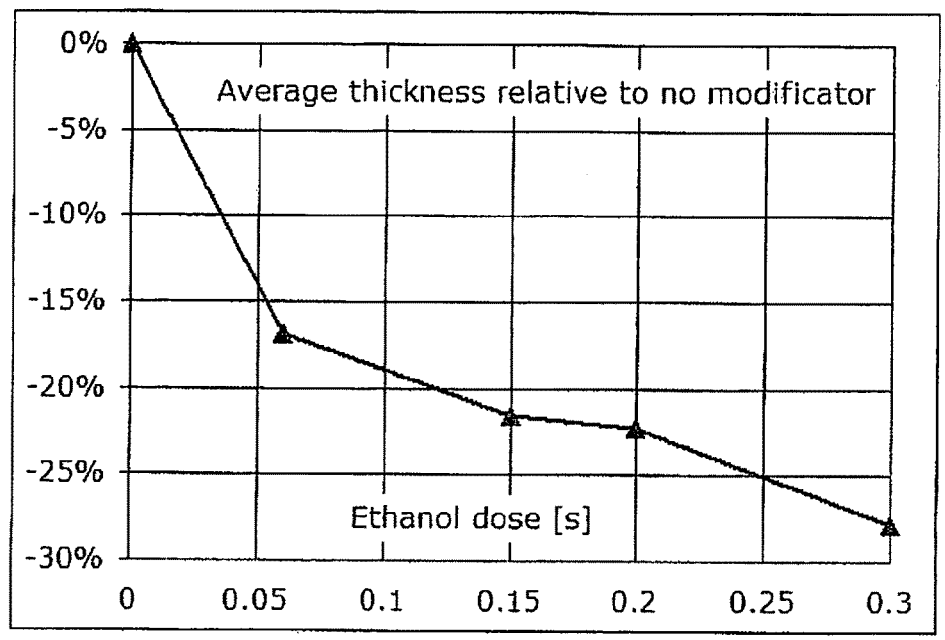

FIG. 4 shows the effect of ethanol dose amount on the average thickness. A higher modificator dose decreases the average thickness, but beyond a certain limit, a higher dose does not cause large effects to the thickness profile along the flow direction.

Figure 5:
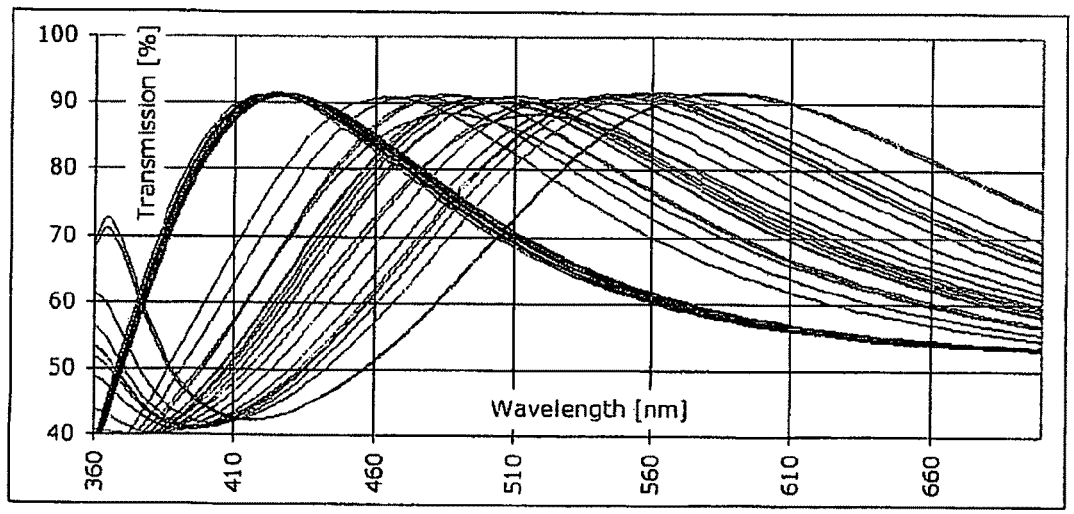
FIG. 5 shows optical transmission curves from samples coated with $TiO_2$ with and without modificator.

FIG. 5 is an example of the effect of the modificator. A TiO$_2$ coating process was carried out with and without modificator. The transmission was measured at 22 locations in a large batch. The reasonably tightly distributed curve set on the left represents the case with modificator. The curves on the right are without modificator.

EXAMPLES

A number of experiments were conducted and are presented herein for exemplary purposes only, and are not meant to limit the scope of the invention.

Development work was carried out using the deposition tool Planar Systems P400 ALD reactor, commercially available from Planar Systems Oy, Espoo, Finland. This deposition tool is a most mature and reliable tool for ALD manufacturing and research purposes and it is especially suitable for applications requiring high capacity, high accuracy and low cost. Ethanol was selected as a modificator for the examples. The results demonstrate the effect of ethanol on the layer thickness and refractive index. Thickness and refractive index were measured by ellipsometer (single wavelength 633 nm).

Only the TiO$_2$ process was somewhat optimized.

It is obvious for the person skilled in the art, that deposition cycle times depend on many parameters relating to coating tool design and process requirements. The time periods in these examples are for reference only.

Titanium oxide was made using TiCl$_4$ and DI water.

Aluminium oxide was made using AlCl$_3$ and DI water. Hafnium oxide was made using HfCl$_4$ and DI water. The nitrogen gas used was 99.999% pure.

In all three examples:

The ALD deposition zone included a batch cassette.

After loading the cassette into the deposition zone, the deposition zone was pumped to vacuum.

The total continuous N$_2$ gas flow rate to the coating tool was adjusted to 2.5 SLM (Standard liters per minute) in order to maintain an absolute pressure of about 100 Pa around the objects to be coated.

Precursors and ethanol were carried to the deposition zone by using part of the total N$_2$ gas flow. Heating time was a bit longer (as indicated) with the larger cassettes.

Total cycle count indicates how many times each cycle was repeated.

Example 1

TiO$_2$ Deposition

The ALD deposition zone included a batch cassette with 36 shelves. The distance between shelves was about 4.5 mm (surface to surface). The width of the shelf was 240 min and length 500 mm. Pieces of silicon wafer were loaded onto shelf number 19, in the middle of the cassette, and measurements were made from these pieces.

The heated reaction zone was allowed to stabilize for about 6 hours, during which time the reaction zone reached a temperature of about 280° C.

The used pulse lengths, total cycle count and resulting average thickness are given in table 1. Thickness and refractive index results are given in charts 1 and 2.

The change of the thickness profile is clearly visible in the chart 1. The use of ethanol decreased the growth rate on the inlet side. Ethanol also increases the refractive index, indicating that the deposited material is more dense than without modificator. Abnormally large water doses were used without ethanol to demonstrate the "best possible" deposition uniformity with the normal ALD process. High water doses also increased the average thickness.

Measurement of the refractive index of the thin film like 5 nm includes errors. The absolute values are not important. Values are shown to indicate that invented method can affect film properties like the refractive index.

TABLE 4

|  | Without ethanol | With ethanol |
| --- | --- | --- |
| Total cycle count | 120 | 175 |
| TiCl$_4$ dose | 1.00 s | 1.00 s |
| Purge | 1.10 s | 1.10 s |
| H$_2$O dose | 2.00 s | 0.35 s |
| Purge | 3.15 s | 1.00 s |
| Ethanol dose |  | 0.35 s |
| Purge |  | 1.00 s |
| Average thickness | 5.2 nm | 4.3 nm |

Example 2

Al$_2$O$_3$ Deposition

The ALD deposition zone included a batch cassette with 36 shelves. The distance between shelves was about 4.5 mm (surface to surface). The width of the shelf was 240 mm and length 500 mm. Pieces of silicon wafer were loaded onto shelf number 19, in the middle of the cassette, and measurements were done from these pieces.

The heated reaction zone was allowed to stabilize for about 6 hours, during which time the reaction zone reached a temperature of about 280° C.

The used pulse lengths, total cycle count and resulting average thickness are shown in Table 2. Thickness and refractive index results are shown in charts 3 and 4.

The change of the thickness profile is clearly visible in chart 3. The use of the ethanol decreased the growth rate at the inlet side. Ethanol also increased the refractive index, indicating that the deposited material is more dense.

TABLE 5

|  | Without ethanol | With ethanol |
| --- | --- | --- |
| Total cycle count | 1200 | 1200 |
| AlCl$_3$ dose | 1.40 s | 1.40 s |
| Purge | 2.10 s | 2.10 s |
| H$_2$O dose | 1.50 s | 1.50 s |
| Purge | 3.35 s | 1.00 s |
| Ethanol dose |  | 0.35 s |
| Purge |  | 2.00 s |
| Average thickness | 124.4 nm | 115.0 nm |

Example 3

HfO2 Deposition

The ALD deposition zone included a batch cassette with 23 shelves. The distance between shelves was about 8 mm (surface to surface). The width of the shelf was 240 mm and length 360 mm. Pieces of silicon wafer were loaded onto shelf number 13, in the middle of the cassette, and measurements were made from these pieces.

The heated reaction space was allowed to stabilize for about 3 hours, during which time the reaction space and object to be coated reached a temperature of about 300° C.

The used pulse lengths, total cycle count and resulting average thickness are shown in table 6. Thickness and refractive index results are shown in charts 5 . . . 8.

The change of the thickness profile is clearly visible in charts 5 and 7. The use of ethanol decreased the growth rate on the inlet side. Two sets of runs were done:

Runs 579 and 580 had smaller $HfCl_4$ dosing. The purge between $H_2O$ and ethanol was short. Ethanol dosing was smaller. The purge between ethanol and $HfCl_4$ was very short. Runs 581 and 582 had larger $HfCl_4$ dosing due to increased source temperature. The purge between $H_2O$ and ethanol was longer. Ethanol dosing was larger. The purge between ethanol and $HfCl_4$ was longer. Ethanol also increased the refractive index in run 581, indicating that the deposited material is more dense.

The $HfCl_4$ temperature indicates the set value of the $HfCl_4$ source. It is not the actual temperature of the $HfCl_4$. The purpose is to show that $HfCl_4$ dosing was increased in runs 581 and 582.

TABLE 6

|  | 579 | 580 | 581 | 582 |
|---|---|---|---|---|
| Total cycle count | 800 | 800 | 800 | 800 |
| $HfCl_4$ temperature | 252 C. | 252 C. | 258 C. | 258 C. |
| $HfCl_4$ dose | 4.00 s | 4.00 s | 4.00 s | 4.00 s |
| Purge | 2.40 s | 2.40 s | 2.40 s | 2.40 s |
| $H_2O$ dose | 1.50 s | 1.50 s | 1.50 s | 1.50 s |
| Purge | 3.40 s | 0.30 s | 1.50 s | 4.10 s |
| Ethanol dose |  | 0.45 s | 1.00 s |  |
| Purge |  | 0.1 s | 1.50 s |  |
| Average thickness | 56.3 nm | 69.4 nm | 60.3 nm | 58.0 nm |

The invention claimed is:

1. A method for reducing or eliminating layer non-uniformity in an ALD or ALD-type process for depositing a metal oxide film, the method comprising the following phases:
   a) exposing a surface to a first precursor or precursor mixture comprising at least one metal halide,
   b) exposing the resulting surface to a second precursor selected from the group consisting of water, hydrogen peroxide, tert-butanol and mixtures of these,
   c) exposing the resulting surface to at least one modificator comprising a chemical substance selected from the group consisting of alcohols having one to three carbon atoms,
   wherein steps (a), (b), and (c) provide a metal oxide film that is deposited on the surface.

2. A method according to claim 1, comprising the repetition of phases b-c at least once.

3. A method according to claim 1, comprising repetition of phases a-c at least once.

4. A method according to claim 3, comprising at least one cycle of phases a and b without phase c.

5. A method according to claim 1, wherein phases a) and/or b) comprises the use of several of the precursors in succession.

6. A method according to claim 1, wherein the modificator is methanol, ethanol or n-propanol.

7. A method according to claim 1, wherein said non-uniformity reduction relates to non-uniformity of physical layer thickness.

8. A method according to claim 1, wherein said non-uniformity reduction relates to non-uniformity in crystallinity.

9. A method according to claim 1, wherein an oxide of Ta, Ti, Al, Hf, Zr, or Nb, or a combination of these oxides is deposited.

10. A method according to claim 1, wherein the first precursor is selected from the group consisting of tantalum chloride, titanium chloride, aluminium chloride, hafnium chloride, zirconium chloride and niobium chloride and mixtures of these.

11. A method according to claim 1, further comprising at least one purging operation.

12. A method according to claim 1, wherein a dose of second precursor and a dose of modificator overlap, fully or partially.

13. A method according to claim 1, wherein the phases are implemented in a coating application, where two or more surfaces are coated and the distance between the surfaces to be coated is <12 mm.

14. A method according to claim 1, wherein the phases are implemented in a coating application, where two or more surfaces are coated and the distance between the surfaces to be coated is <1 micrometer.

15. A method according to claim 1, wherein the phases are performed in an ALD reactor.

16. A method according to claim 1, wherein the phases are performed for depositing an optical film or a film stack.

17. The method according to claim 16, wherein the film stack contains titanium oxide and silicon oxide, titanium oxide and aluminium oxide, or titanium oxide, aluminium oxide and silicon oxide.

18. The method according to claim 16, wherein the surface where the optical film is deposited is a glass substrate.

19. A method according to claim 1, wherein the phases are performed for depositing a dielectric film or a film stack.

20. The method according to claim 19, wherein the film stack contains at least one of titanium oxide, aluminium oxide, hafnium oxide, zirconium oxide, tantalum oxide, and niobium oxide.

21. The method according to claim 20, wherein the surface where the dielectric film is deposited is a silicon wafer or a structure made on a silicon wafer.

22. A method according to claim 1, wherein the surface is an inner surface of a tubular structure.

* * * * *

UNITED STATES PATENT AND TRADEMARK OFFICE
CERTIFICATE OF CORRECTION

| | |
|---|---|
| PATENT NO. | : 8,367,561 B2 |
| APPLICATION NO. | : 12/663782 |
| DATED | : February 5, 2013 |
| INVENTOR(S) | : Jarmo Maula et al. |

Page 1 of 1

It is certified that error appears in the above-identified patent and that said Letters Patent is hereby corrected as shown below:

On the Title page, in item (30), change "07397023" to --07397023.8--.

Signed and Sealed this
Nineteenth Day of March, 2013

Teresa Stanek Rea
*Acting Director of the United States Patent and Trademark Office*